United States Patent [19]

Schweitzer, Jr.

[11] 4,152,643
[45] May 1, 1979

[54] VOLTAGE INDICATING TEST POINT CAP

[75] Inventor: Edmund O. Schweitzer, Jr., Northbrook, Ill.

[73] Assignee: E. O. Schweitzer Manufacturing Co., Inc.

[21] Appl. No.: 895,151

[22] Filed: Apr. 10, 1978

[51] Int. Cl.² .................. G01R 19/26; G01R 31/02
[52] U.S. Cl. ............................ 324/120; 324/72.5; 324/122; 324/133; 340/654
[58] Field of Search ............. 324/120, 122, 96, 133, 324/72.5, 149; 340/654, 660; 174/11 BH, 143

[56] References Cited

U.S. PATENT DOCUMENTS

| | | | |
|---|---|---|---|
| 3,390,331 | 6/1968 | Brown et al. | 324/122 |
| 3,524,133 | 8/1970 | Arndt | 324/120 |
| 3,524,178 | 8/1970 | Stratton | 324/133 |

Primary Examiner—Rudolph V. Rolinec
Assistant Examiner—Ernest F. Karlsen
Attorney, Agent, or Firm—Lockwood, Dewey, Alex & Cummings

[57] ABSTRACT

A test point cap provides a visual indication of the voltage level of an alternating current in the conductor of a connector on which the cap is installed. The test point cap includes a bridge-type rectifier circuit which is capacitively coupled to the conductor through a test point terminal on the connector. The rectifier circuit charges a capacitor across which a neon lamp visible through a window in the end of the cap is connected, the rate at which the neon lamp flashes providing an indication of the voltage level on the conductor.

7 Claims, 6 Drawing Figures

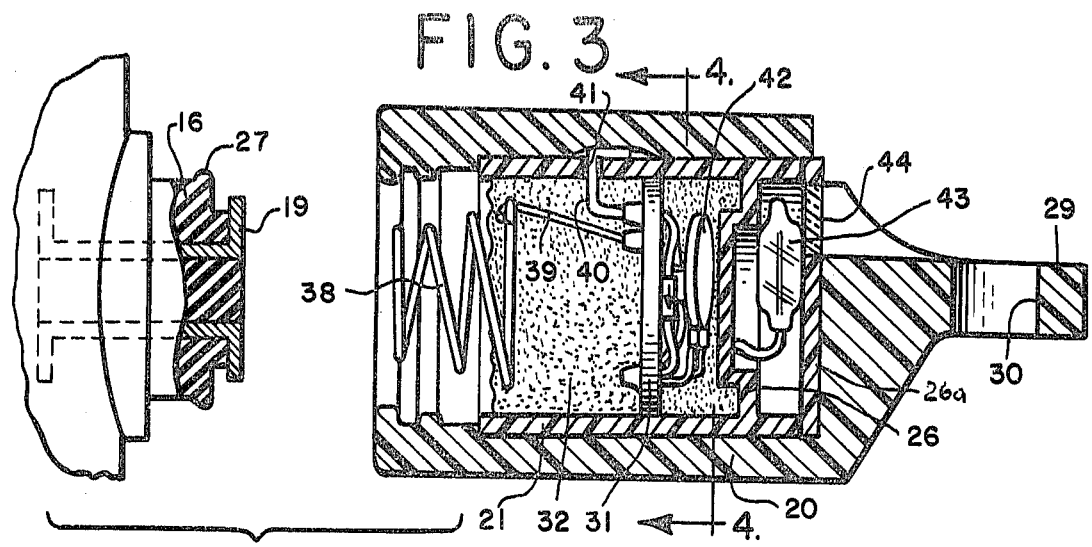
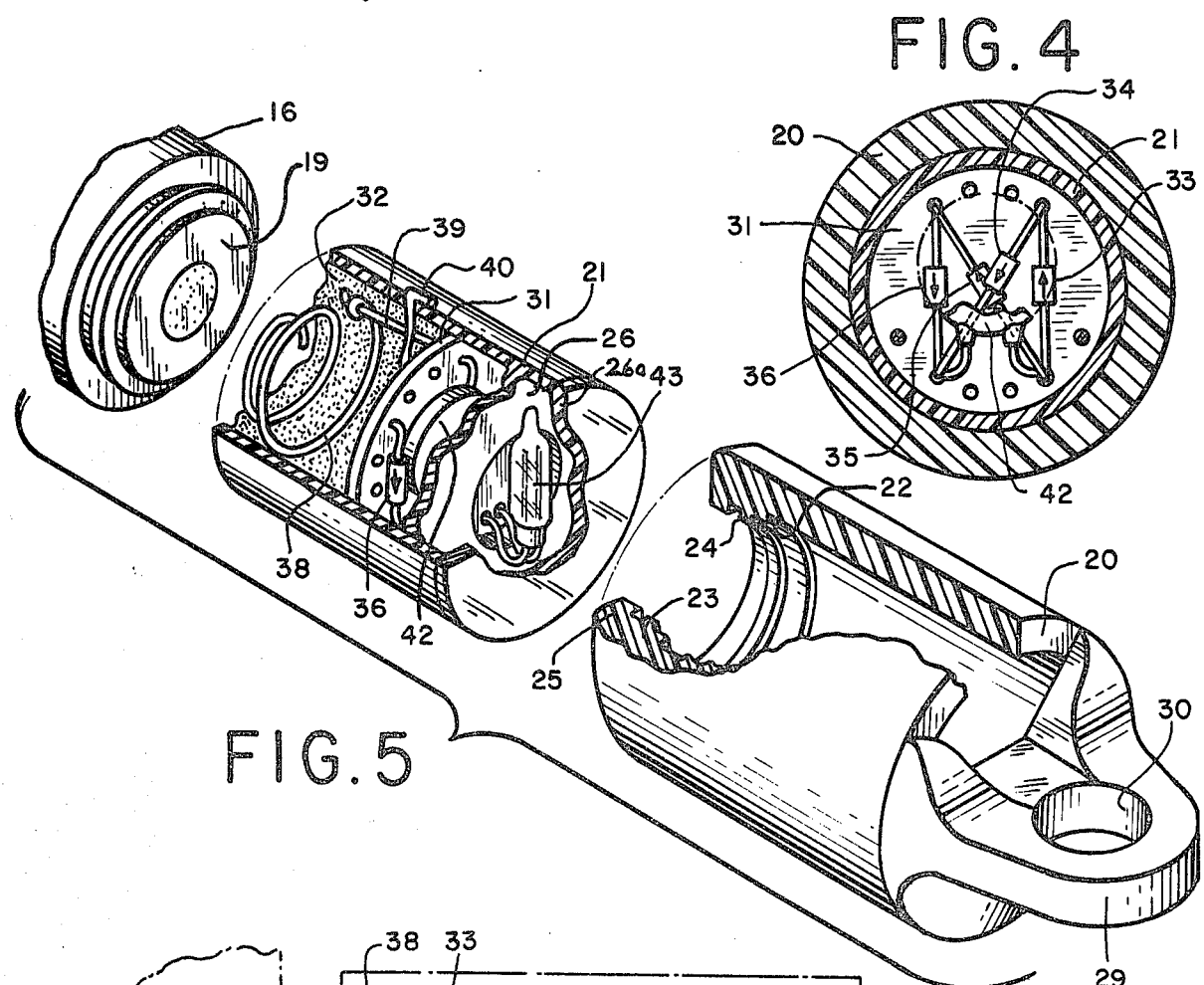
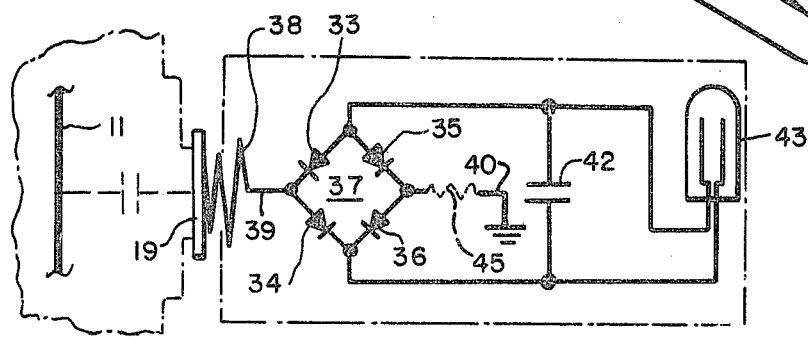

VOLTAGE INDICATING TEST POINT CAP

BACKGROUND OF THE INVENTION

The present invention relates generally to voltage level indicators for use with connectors employed in alternating current high voltage circuits, and more particularly, to a voltage-indicating test point cap for mounting on the test point terminal of an elbow connector or the like to provide a visual indication of the voltage level present in such connectors.

Often cables used to carry alternating current at high voltage levels in power generating and distribution systems are connected to transformers and other system components by means of plug-in connectors which snap onto a complementary terminal on the component. Connectors of this type often provide one or more test points for capacitively coupling test devices such as fault indicators to the conductor of the connector. One such fault indicator is disclosed in my U.S. Letters Pat. No. 3,906,477, issued Sept. 16, 1975.

Various types of indicator circuits have heretofore been provided for determining whether the conductor of a connector is energized by a high voltage current. Examples of such indicator circuits may be seen in U.S. Letters Pat. Nos. 3,524,178 and 3,328,690. While such indicator circuits provided means for determining whether the conductor is energized, they did not provide an indication of the voltage level on the conductor. Although apparatus for determining voltage level on a conductor is known, such as that disclosed in U.S. Letters Pat. No. 3,660,757, such apparatus has been unsatisfactory for use in conjunction with connector test points.

SUMMARY OF THE INVENTION

It is an object of the present invention to provide a new and improved test point cap which mounts to a test point terminal provided on an electrical connector, and which is interchangeable with test point caps containing other types of test circuits which also may mount on the test point terminal to provide a visual indication of the voltage level within the connector.

In accordance with this and other objects of the present invention, a test point cap is provided which comprises an outer shell of electrically-conductive rubber material having an open end for telescopically mounting to the test point terminal of a connnector and a closed end having a transparent window. A voltage indicator circuit, which includes a bridge-type full wave rectifier having a capacitor coupled across its output terminals, is mounted within a cylindrical housing concentrically disposed within the outer shell. One input terminal of the rectifier is connected to the test point terminal contact by a helical spring contact at the open end of the shell, and the other input terminal is connected to the outer shell by a conductor extending through an aperture in the tubular housing. When the conductor of the connector is energized by a high voltage alternating current, a corresponding current is induced in the test point contact and coupled to the bridge rectifier via the helical spring contact. The rectified current available at the output terminal of the rectifier charges the capacitor, and when the charge on the capacitor reaches the flash potential of a neon lamp connected across the capacitor, the neon lamp emits a flash of light which is observable through the window. The rate at which the neon lamp flashes as the capacitor is charged and discharged is proportional to the voltage level in the connector, so that by observing the rate of flashing of the neon lamp a determination of the voltage level can be made.

The test point terminal to which the test point cap is mounted preferably comprises a projection of insulating material protruding through an outer conductive sheath of the connector from an interior insulating member and includes an electrical contact embedded therein which has an exposed portion at the end of the terminal. An inwardly directed annular flange at the open end of the outer shell snaps over an annular rib on the test point terminal to mount the test point cap to the terminal such that the outer shell contacts the grounded connector sheath.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 3 is an elevational view, partly in section, showing the test point cap disassembled from the connector test point terminal;

FIG. 4 is a sectional view taken along line 4—4 in FIG. 3 showing the circuit components mounted on the circuit board in the test point cap;

FIG. 5 is a fragmentary perspective view showing the test point cap in a partially disassembled state; and FIG. 6 is a schematic circuit diagram of the voltage level indicator circuit of the test point cap.

DESCRIPTION OF THE PREFERRED EMBODIMENT

Figures 1, 2:
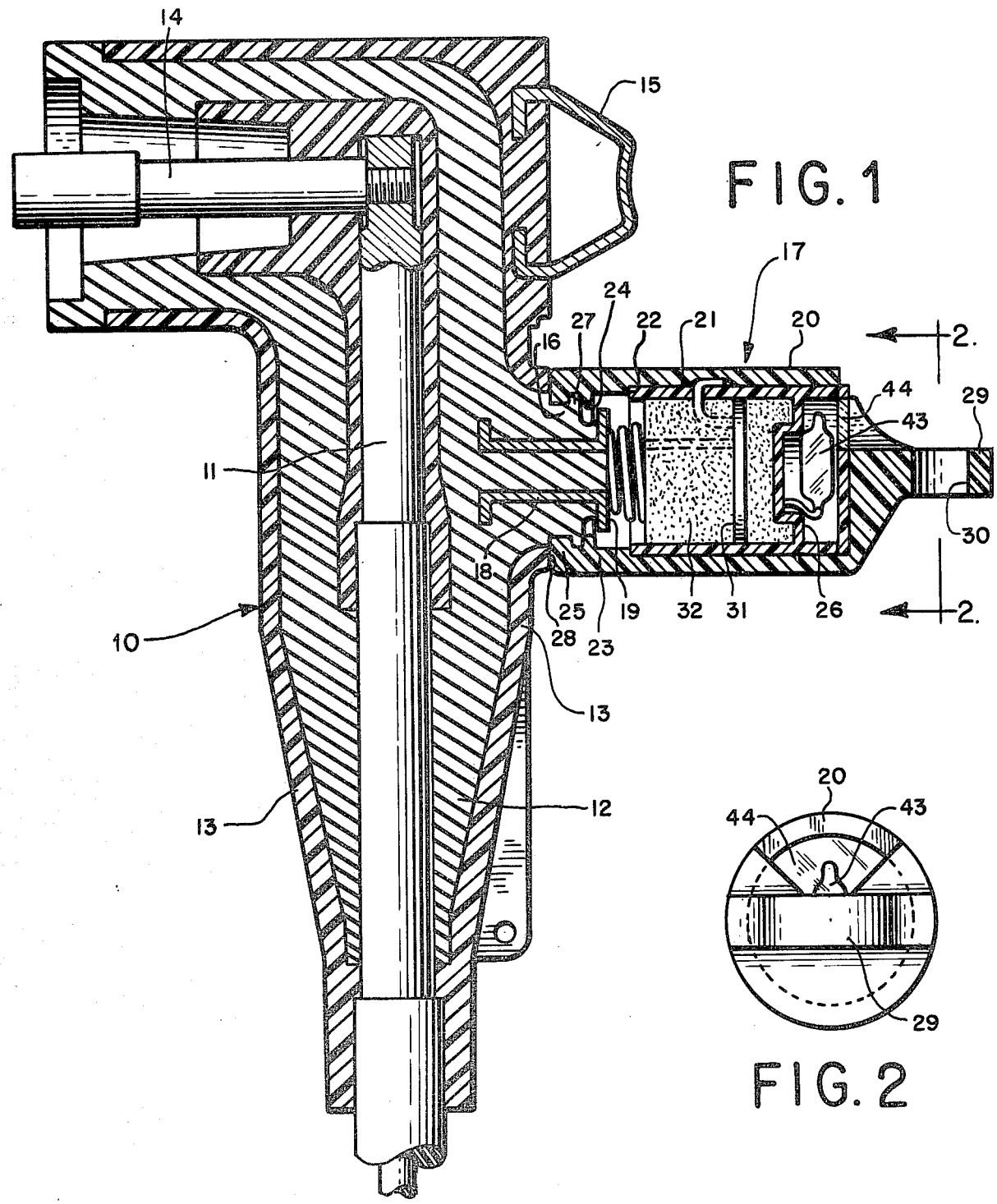
FIG. 1 is an elevational view, partly in section, illustrating a test point cap constructed in accordance with the present invention mounted to the test point terminal of a plug-in elbow connector.
FIG. 2 is a cross-sectional view taken along line 2—2 in FIG. 1.

Referring to the drawings, and particularly to FIG. 1, a plug-in elbow connector of conventional construction for use in high voltage alternating current systems for establishing a plug-in connection to a transformer (not shown) or other device is identified generally by reference numeral 10. As shown, the connector 10 includes generally an axial conductor 11 extending through an insulating member 12 encased in a conductive sheath 13, the sheath being grounded in accordance with conventional practice. A conductive plug-in receptacle 14, threaded at one end and received into a correspondingly threaded hole in the end of the conductor 11, extends from the conductor 11 in the connector 10 and is arranged to mate with a complementary contact on the device. An arcuate member 15 having ends anchored in the conductive sheath 13 extends from the connector to receive the hooked end of a tool commonly used to remove plug-in connectors from such devices.

With reference also to FIGS. 3 and 5, a test point terminal 16 comprising a projection of the insulating member 12 protruding from the connector through the conductive sheath 13 is provided to receive a test point cap 17 such as that of the present invention, the cap 17 telescopically mounting on the terminal 16. Embedded in the test point terminal 16 is an electrically conductive contact 18 having an annular outer flange portion 19 which is exposed at the outer end of the terminal to provide an electrical connection to the contact and an inner portion in proximity to conductor 11 to capacitively couple voltage level indicating circuitry in the test point cap 17 to the conductor 11 of the conductor.

The test point cap 17 comprises an electrically conductive rubber outer shell 20 which is open at one end for mounting to the connector test point terminal 16. The shell 20 is hollow for receiving a correspondingly sized cylindrical housing 21 containing the electrical components of the voltage indicator circuit. Housing 21 may be held in position by an annular flange 22 on the inside surface of shell 20. The annular flange 25 extends inwardly at the open end of the outer shell 20 to secure the shell over a test point. The cylindrical housing 21 includes an integral partition 26 which serves as a mask and spacing element; and an end cap 26a which is sonically welded to the end of the housing.

When the test point cap 17 is installed on the test point terminal 16, the annular end flange 25 of the outer shell snaps over an exterior annular rib 27 on the terminal and is held in position on the test point terminal 16 by the rib 27 which bears against the interior surface of the end flange 25 of the shell. The interior annular rib 24 of the rubber shell, in turn, bears against the opposite side of the rib 27 to seal the shell 20 to the test point terminal 16. The outer surface of the annular end flange 25 of the shell engages a lip 28 of the connector sheath 13 adjacent the base of the test point terminal 16 to make electrical contact therewith and ground the shell 20. At the closed end of the shell 20, a tab 29 having an aperture 30 therethrough is provided to facilitate the removal of the test point cap 17 with a conventional hooked lineman's tool.

In FIGS. 3 through 5, inclusive, a disc-shaped insulator board 31 is shown to be positioned perpendicular to the axis of the housing in a location intermediate the ends thereof and secured in position by an epoxy material 32 filling the housing. The insulator board 31 serves as a mounting means for the electrical components of the voltage level indicator circuit shown schematically in FIG. 6. There, the circuit is seen to include four diodes 33-36 interconnected in a conventional bridge-type full wave rectifier configuration identified generally by reference numeral 37.

The junction of diodes 33 and 34, a first input terminal of the bridge rectifier, is electrically connected to the test point terminal contact 18 by a helical spring contact 38. At one end, the spring contact 38 is connected, such as by soldering, to a wire conductor 39 extending in the cylindrical housing 21 from the junction of diodes 33 and 34 through a perforation in the insulator board 31. When the test point cap 17 is installed on the test point terminal 16, the spring contact 38 is resiliently pressed against the annular flange 19 of the terminal contact to effect the connection between the test point terminal contact and the voltage level indicator circuit. The junction of diodes 35 and 36, which comprises the other input terminal of the bridge rectifier, is grounded by a wire conductor 40. In particular, the conductor 40 extends through a perforation in the insulator board 31, where it is soldered to the rectifier bridge 37, and an aperture 41 in the wall of the tubular housing 21. There, the other end of the wire conductor 40 is compressively wedged between the cylindrical housing 21 and the outer shell 20 such that the connection to ground is completed through the electrically conductive outer shell to the grounded connector sheath 13.

When the conductor 11 in the connector is energized by a high voltage alternating current, a corresponding alternating current is capacitively induced in the test point terminal contact 18. The induced current is coupled through the helical spring contact 38 and the wire conductor 39 to the full wave rectifier bridge 37 which, in turn, rectifies the induced current to charge a capacitor 42 connected across the output terminals of the bridge rectifier, between the junction of diodes 33 and 35 and the junction of diodes 34 and 36.

To provide an indication of the voltage level on conductor 11, a neon lamp 43 is connected across capacitor 42 and positioned in the space between the closed end of outer shell 20 and mask 26, with its lead wires extending through the mask to connect to capacitor 42 and rectifier bridge 37 at insulator board 31. As illustrated in FIG. 2, the neon lamp 43 is positioned by means of mask 26 in substantial alignment with a transparent window 44 in the end wall of the shell and can be observed from a vantage point external to the test point cap. As capacitor 42 is charged by the unidirectional current developed by the bridge rectifier, the voltage level across the capacitor increases. Eventually, the charge on the capacitor reaches the flash threshhold of the neon lamp, and the lamp emits a flash of light as it discharges the capacitor. Since the voltage developed by the rectifier is proportional to the voltage level on connector 11, and since the capacitor is charged at a rate which is proportional to the output voltage level of the rectifier, by observing the rate at which the neon lamp 43 flashes a determination of the voltage level on the conductor 11 can be made.

While the use of a neon lamp 43 has been shown in the illustrated embodiment, it will be appreciated that other light emitting discharge devices, such as light emitting diodes, could be used instead with appropriate adjustment of circuit parameters. Furthermore, a half-wave rectifier circuit can be substituted for the fullwave circuit illustrated where slower charging rates for capacitor 42 can be tolerated.

To provide for calibration of the voltage indicator, i.e., to obtain a specific flashing rate for a particular voltage on conductor 11, a calibration resistor 45 may optionally be provided in series with one of the input terminals of rectifier network 37. This resistor may either be provided in lead 40, as shown in FIG. 6, or in lead 39. In either case, the resistor functions to adjust the charging rate of capacitor 42 to obtain the desired flashing rate.

In one successful commercial embodiment of the invention for use on electrical circuits operating within a range of 2.5–34 kilovolts, the following components were utilized:

Diodes 33-36; Type 1N4007
Capacitor 42; 0.1 mfd ceramic 100V
Neon lamp 43; NE2H

With this circuit a 5.0 kilovolt line voltage provided a flashing rate of one per second, and a 10.0 kilovolt line voltage provided a flashing rate of two per second.

The outer shell 20 was constructed of an electrically-conductive elastomeric compound with a length of approximately 4.0 inches, an outside diameter of approximately 2.0 inches, and an opening of approximately 1.25 inches. The cylindrical housing 21 was constructed of a transparent Lexan (a trademark of the General Electric Company) polycarbonate material with a length of approximately 1.75 inches, an outside diameter of approximately 1.5 inches, and a wall thickness of approximately 0.125 inch. The insulator board 31 was constructed of a phenolic material and the mask member 26 was formed integrally with housing 21. In practice, the actual dimensions and materials used will vary with the particular application.

Thus, the test point cap of the present invention provides a voltage indicator of compact economical construction which can be easily attached to and removed from conventional test points such as found on elbow connectors and the like.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A voltage-indicating test point cap for mounting to the test point terminal of a connector employed in a high-voltage system wherein the connector includes a conductor embedded in an insulating member encased in a conductive sheath referenced to ground, and wherein the test point terminal includes a projection of the insulating member extending through the conductive sheath and having an electrically conductive test point contact embedded in the insulating member, the test point contact having an exposed portion at the outer end of the test point terminal, alternating current in the conductor capacitively inducing a proportional alternating current at the test point contact, said voltage-indicating test point cap comprising, in combination:

circuit means including a rectifier having input terminals and output terminals;

said circuit means including a capacitor coupled across said output terminals, and a light-emitting voltage discharge device coupled across said capacitor;

means including an electrically conductive outer shell having an open end for mounting to said test point terminal and a closed end, and a window, said outer shell contacting said grounded connector sheath when said test point cap is mounted on said test point terminal;

a cylindrical housing telescopingly disposed within said outer shell, at least the portion of said housing adjacent said window being transparent;

said light-emitting discharge device being located within said cylindrical housing in substantial alignment with said window;

an electrically conductive spring contact disposed within said cylindrical housing, said spring contact having one end connected to one of said input terminals of said rectifier and its other end disposed for engaging said exposed portion of said test point contact;

the other one of said input terminals of said rectifier being coupled to said outer shell to reference said rectifier to ground, said induced current being coupled to said rectifier by said contact and rectified by said rectifier to charge said capacitor, said discharge device emitting a flash of light through said window upon said capacitor charging to the flash potential of said discharge device, the rate of said flashes being proportional to the voltage level of the alternating current applied to said conductor.

2. A voltage-indicating test point cap in accordance with claim 1 wherein said test point terminal includes an annular rib extending around said projection adjacent said outer end thereof and wherein said outer shell includes an inwardly directed annular flange at said open end, said flange snapping over said rib and having an interior surface bearing against said rib to releasably secure said test point cap to said test point terminal.

3. A voltage-indicating test point cap in accordance with claim 2 wherein said end flange includes an exterior surface which contacts said sheath to ground said outer shell when said test point cap is mounted to said test point terminal.

4. A voltage-indicating test point cap in accordance with claim 1 wherein said cylindrical housing includes an aperture, and wherein said cap includes a wire conductor having one end connected to said other of said bridge rectifier input terminals and another end extending through said aperture, said other end of said wire conductor being compressively wedged between said outer shell and said cylindrical housing to effect an electrical connection to said outer shell.

5. A voltage-indicating test point cap in accordance with claim 1 wherein said spring contact comprises an electrically conductive helical spring contact substantially coaxially disposed within said cylindrical housing.

6. A voltage-indicating test point cap in accordance with claim 5 including an epoxy material filling said cylindrical housing.

7. A voltage-indicating test point cap in accordance with claim 1 wherein said outer shell includes a tab extending from said closed end, said tab having an aperture therethrough for receiving a tool for removing said test point cap from said test point terminal.

* * * * *